United States Patent [19]

Islam

[11] 4,400,870
[45] Aug. 30, 1983

[54] METHOD OF HERMETICALLY ENCAPSULATING A SEMICONDUCTOR DEVICE BY LASER IRRADIATION

[75] Inventor: Safidul Islam, Richardson, Tex.

[73] Assignee: Texas Instruments Incorporated, Dallas, Tex.

[21] Appl. No.: 194,108

[22] Filed: Oct. 6, 1980

[51] Int. Cl.³ .............................................. H01L 21/52
[52] U.S. Cl. ........................................ 29/588; 29/589; 219/121 LD
[58] Field of Search ............. 29/588, 589; 174/52 FP, 174/52 H; 357/74; 219/121 L, 121 LC, 121 LD, 121 LM

[56] References Cited

U.S. PATENT DOCUMENTS 4,291,815  9/1981  Gordon et al. ............. 174/52 FP X

FOREIGN PATENT DOCUMENTS 45-4144  2/1970  Japan ....................... 29/588

*Primary Examiner*—L. Dewayne Rutledge
*Assistant Examiner*—Alan E. Schiavelli
*Attorney, Agent, or Firm*—Peter J. Thoma; N. Rhys Merrett; Melvin Sharp

[57] ABSTRACT

A hermetic seal is formed without expensive precious metals by fusing two members of a semiconductor package together by scanning a laser beam along adjacent edges of the members. The compositions of the members which are fused together include ceramic, glass and metal. The method enables the formation of a hermetic seal at a relatively low temperature thereby greatly reducing the thermal stress on the semiconductor chip with resulting improvement in yields.

4 Claims, 9 Drawing Figures

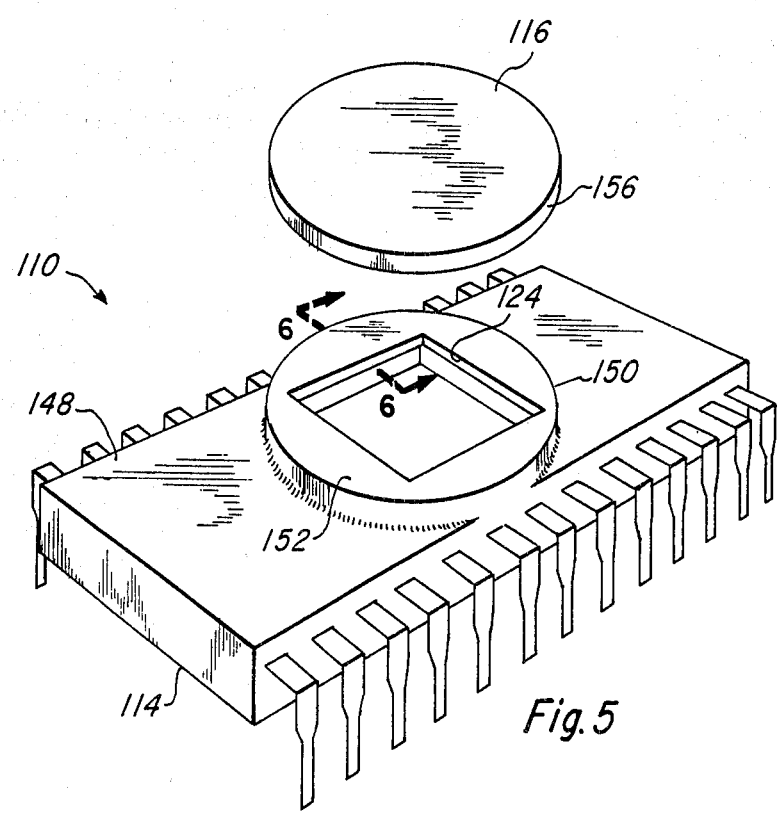
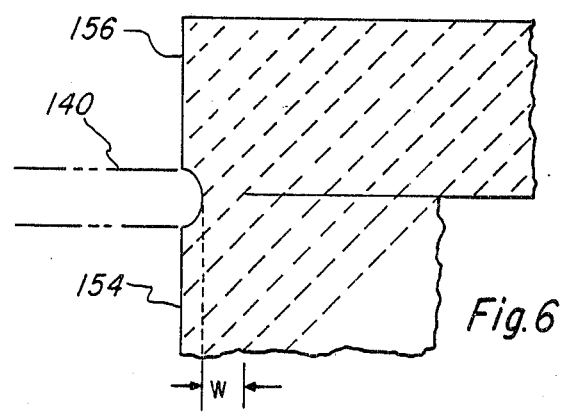

METHOD OF HERMETICALLY ENCAPSULATING A SEMICONDUCTOR DEVICE BY LASER IRRADIATION

The present invention relates generally to semiconductor devices and more particularly to a method of hermetically sealing a semiconductor chip within a package by fusing parts of the package together with a laser beam.

Although semiconductor chips can be encapsulated economically in nonhermetic plastic packages, in many applications it is desirable or necessary to provide hermetic packages. Heretofore the techniques employed in forming hermetic seals have added significantly to the cost of producing semiconductor devices. In the case of integrated circuit devices, semiconductor bars or chips are ordinarily sealed within conventional dual in-line packages. A typical dual in-line package includes a ceramic header upon which the chip is mounted and from which external leads extend and a lid which is mounted atop the header to encapsulate the chip within the package. The techniques employed in the prior art to hermetically seal the lid to the header have either required expensive materials (e.g., gold) to produce a reliable device, or have subjected the device to yield-diminishing elevated temperatures, or both.

In one such prior-art technique, which is presently in widespread use, a metallic lid is soldered to a ceramic header using a solder preform which typically comprises 80% gold and 20% tin. The lid typically comprises an iron-nickel-cobalt alloy sold under the trademark "Kovar." Ceramic and Kovar are preferred materials in the manufacture of semiconductor packages due to, among other things, their coefficients of thermal expansion, which are compatible with semiconductor chips made of silicon. Both the lid and at least the surfaces of the header to which the lid is joined are gold-plated to assure good, even wetting by the solder so that a reliable hermetic seal will thus be formed. The soldering step is ordinarily accomplished by passing the assembly of the header, solder preform and lid, all of which are held in place by a springclip, through a furnace so that the assembly experiences a time-temperature profile typically having a peak temperature of 360° C. and a dwell time of about 30 seconds at 350° C. Although this technique produces a hermetic seal of superior quality and reliability, even the small amount of gold employed in the formation of the seal has become a significant factor in the overall cost of producing the typical integrated circuit device.

In another prior-art technique, a ceramic lid having a glass coating on its lower surface is fused to a ceramic header having a glass coating on its upper surface, thereby forming a ceramic-glass-ceramic hermetic seal. Although such prior-art glass sealing techniques employ less expensive materials by comparison to the aforementioned gold soldering technique, it is necessary to expose the assembly to much higher temperatures. For example, a commonly employed glass sealing technique exposes the assembly to a time-temperature profile typically having a 460° C. peak temperature and a dwell time of about 10 minutes at 420° C. Many semiconductor chips are extremely sensitive to temperature and thus experience electrical degradation during fusing of the glass seal. For example, MOS memory devices have been known to experience yield losses of 10% or more when exposed to the relatively high temperature used to form the glass seal. For this reason, hermetically sealed MOS memory devices presently are manufactured predominantly by means of gold solder sealing techniques, which, as previously mentioned, expose the chip to a lower temperature, thereby providing superior process yields.

In accordance with the present invention, a hermetic seal is formed by bonding two members together by localized heating of adjacent surfaces of the members such that the adjacent surfaces become fused together. In the preferred implementation of the invention as applied to hermetically seal an integrated circuit package, a laser is scanned along a joint between a lid and a header to locally heat portions of the surfaces which form the joint.

The present invention provides a significant improvement in the art of hermetically sealing semiconductor devices in that no gold or other precious metal is required to form the seal, nor is it necessary to expose the semiconductor chip to degrading elevated temperatures since only a small fraction of the mass of the package is exposed to a laser beam for a very short period of time.

Additional advantages of the present invention will become apparent from the following detailed description of various preferred embodiments thereof, when read with the accompanying drawings, in which:

FIG. 5 is an exploded perspective view of an alternate embodiment of the invention prior to bonding a lid and header;

FIG. 6 is a schematic cross-section of a portion of the device of FIG. 5 on an enlarged scale taken along line 6—6 of FIG. 5 after bonding the lid to the header;

In the description which follows, similar numerals are used to designate similar parts of the various different embodiments illustrated in the drawings.

Figure 1:
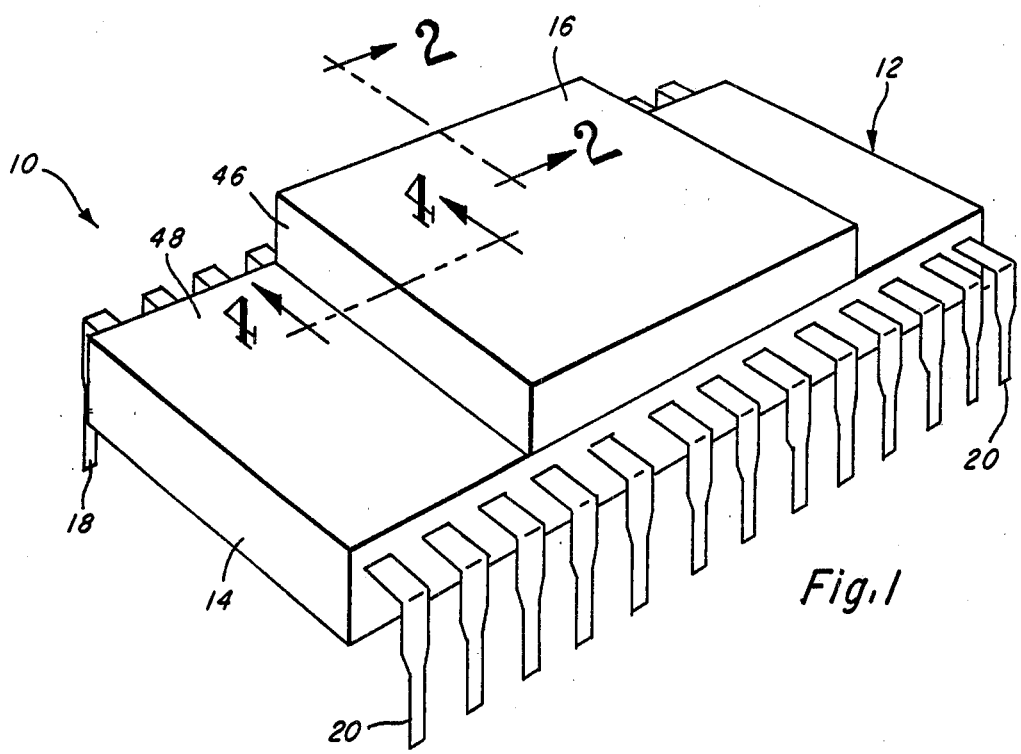
FIG. 1 is a perspective view of a semiconductor device produced in accordance with the present invention.

Referring to FIG. 1, a semiconductor device produced in accordance with the present invention is illustrated and designated generally by reference numeral 10. The device 10 comprises a dual in-line package 12 having a ceramic header 14 and a ceramic lid 16 mounted atop the header. Two rows of metallic leads 18 and 20 extend from opposite sides of the header 14 in a manner which is conventional for dual in-line packages.

Figure 2:
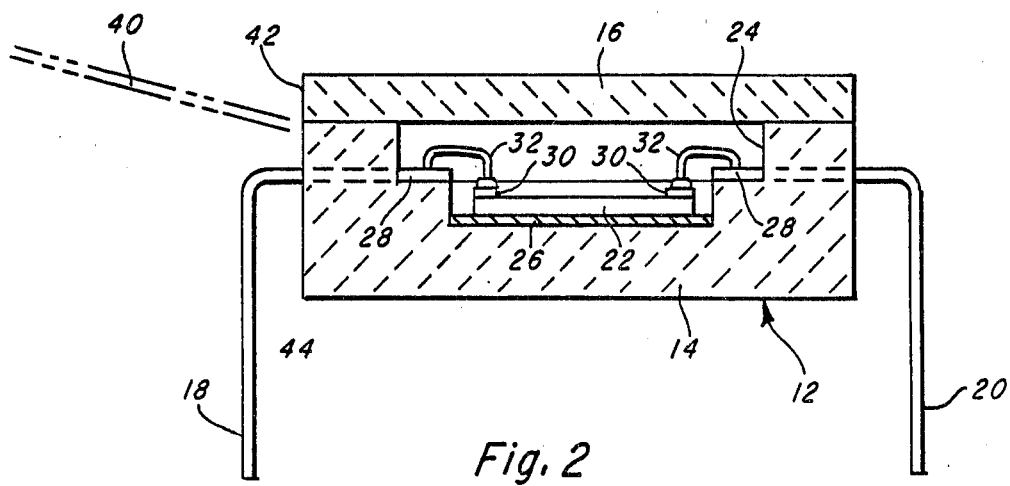
FIG. 2 is a schematic cross section of the device of FIG. 1 taken along line 2—2 of FIG 1.

Referring to FIG. 2, a semiconductor chip 22 is mounted within a cavity or compartment 24 defined by the header 14 and lid 16. Those skilled in the art will appreciate that many thousands of electrical circuit elements such as transistors can be formed in the semiconductor chip 22 using conventional techniques commonly referred to in the art as very large scale integration or VLSI. The chip 22 is bonded to the header 14 by means of a suitable layer 26 adjoining a lower surface portion of the cavity 24. The leads 18 and 20 are sealably bonded within the header 14 in a known manner prior to mounting the chip 22 in the header. Alternatively, conventional side-brazed leads can be employed. Conductive paths 28 are interconnected with the leads 18 and 20 and extend into the cavity 24 to points in proximity to the periphery of the chip 22. Bonding pads 30 are provided on the upper surface of the chip 22 and wire leads 32 are used to interconnect individual bonding pads to the various conductive paths 28.

Figure 3:
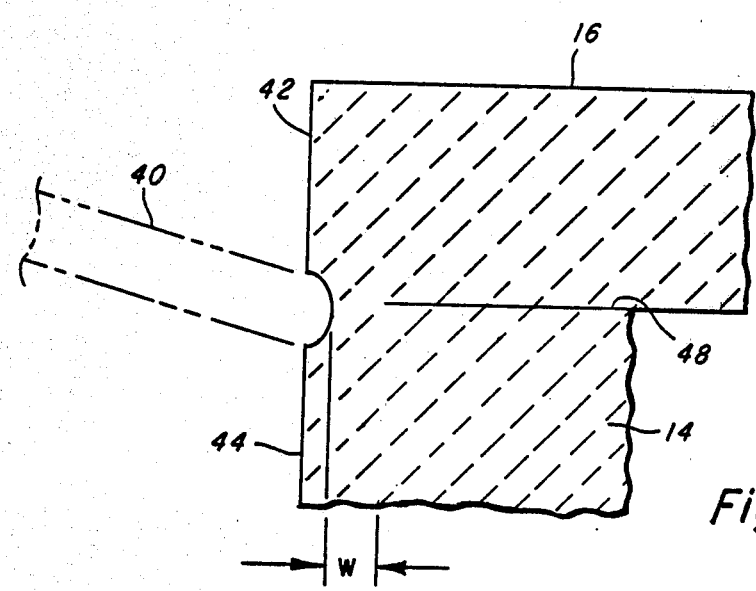
FIG. 3 is an enlarged view of a portion of FIG. 2.
Figure 4:
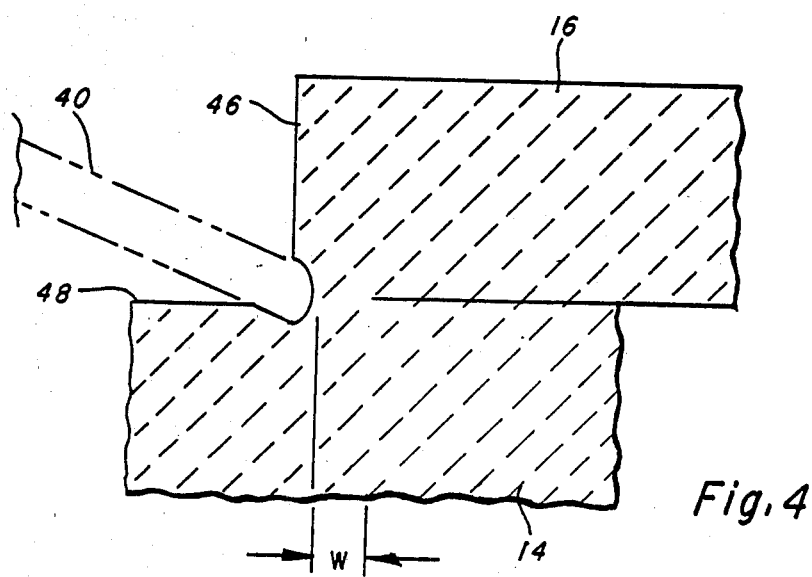
FIG. 4 is an enlarged view similar to FIG. 3 but taken along line 4—4 of FIG. 1.

In accordance with the present invention, the lid 16 is hermetically sealed to the header 14 by fusing adjacent portions together using a beam of radiant energy such as a laser beam, indicated in phantom and designated by reference numeral 40. In the embodiment of the invention illustrated in FIGS. 1-4 the header 14 and lid 16 have the same width dimension but have different length dimensions so that their side edges are flush but their front and rear edges lie in different vertical planes. For example, FIG. 3 typifies the fusing of a side edge 42 of the lid 16 to a side edge 44 of the header 14 and FIG. 4 typifies the fusing of a front edge 46 of the lid 16 to a top surface 48 of the header 14. For ease of bonding the front and rear edges of the lid 16 to the top surface 48 of the header 14, the laser beam 40 is conveniently oriented at a slight angle, such as 15°, above the plane of the top surface 48.

In automating the bonding process for volume production, headers are sequentially brought to a work station (not shown) where lids are placed in proper position on top of the headers and a slight downward force is applied to each lid. Each header-lid package 12 is then aligned with respect to the laser beam 40 and moved along the beam to fuse one of four edges of the lid to the header as typified in FIGS. 3 and 4. The package 12 is then rotated and the process of bonding and rotating repeated until all four edges of the lid are bonded to the adjacent surfaces of the header to form a closed loop, thereby hermetically sealing the compartment 24 from the surrounding atmosphere. Alternate techniques contemplated by the invention include multiple laser systems in which, for example, two parallel edges of the lid are first bonded simultaneously to the header and then the other two parallel edges of the lid are bonded to the header simultaneously at the same work station using the same two lasers, or at a subsequent work station using two additional lasers.

A bond depth W of about 5 mils has been found to provide excellent mechanical strength. Such a bond depth can be achieved using a laser power of 15 to 100 watts and a scan rate of 30 to 100 inches per minute, the parameters varying depending on the heat absorbing properties of the ceramic material being used. A preferred diameter for the laser beam is from about 5 mils to about 7 mils. Excellent results have been achieved using a Series 600-W Model 2660-6R CW Nd:YAG laser sold by Control Laser Corporation of Orlando, Fla. The overlap between the lid 16 and header 14 along the header's upper surface 48 is preferably about 25 mils, which provides ample margin for variations in the bond depth W.

A preferred ceramic material for forming the header 14 and lid 16 has a composition of about 70% to about 80% of a refractory oxide and about 20% to about 30% glass binder material. A suitable refractory oxide is aluminum oxide and a suitable binder material is a mixture of 100 parts boro-silicate glass, such as Corning No. 7052, and 2 parts binder, such as polyethylene glycol polymer.

In order to prevent some tendency for fracturing and the development of microcracks in the ceramic material during laser bonding, it is preferred that the header 14 and lid 16 first be heated to a temperature of about 200° C. When the header and lid are then exposed to the laser beam, they will tend to fuse together without cracking. Fusing the header and lid at such an elevated temperature effectively minimizes the thermal shock of exposure to the laser beam. After the header and lid have been fused on all sides, the package 12 is allowed to cool and is then tested for hermeticity. If a package fails hermeticity testing, it can be reworked by heating the package once again to 200° C. and reexposing the bond to a laser beam. It will be appreciated that a temperature of 200° C. has negligible effect on the semiconductor chip 22 compared to the significantly higher temperatures employed in the prior-art sealing techniques mentioned above.

Referring again to FIG. 2, an important advantage of the inventive process will be described. Those skilled in the art will appreciate that many integrated circuit devices, particularly memory devices, require electrical contact to the backside of the semiconductor chip 22. A preferred and widely practiced technique for making such electrical contact includes the formation of a gold-silicon eutectic bond between the backside of the chip and the header. In the manufacture of semiconductor devices using non-hermetic plastic packages it is possible to use an inexpensive conductive bonding material, such as silver-filled epoxy for contacting the backside of a chip. Heretofore, however, in order to reliably fabricate a memory device in a hermetic package, it has been necessary to heat the package to temperatures of 350° C. or more to form the seal between the lid and the header. Silver-filled epoxy decomposes at such elevated temperatures, and thus, until now, hermetic memory devices have necessarily employed gold in bonding the backside of the semiconductor chip to the header. The present invention enables a hermetic seal to be formed at a relatively low temperature which does not decompose such silver-filled epoxy bonding materials. Accordingly, in the presently preferred embodiment of the invention, the layer 26 comprises a suitable conductive epoxy, such as the commercially available type 826-1 Ablestick silver-filled epoxy.

Referring now to FIGS. 5 and 6, an alternate embodiment of the invention will be described. A semiconductor device 110, which is similar to the previously described device 10, includes a dual in-line package 112 for encapsulating a semiconductor chip (not shown). The package 112 comprises an elongated rectangular ceramic header 114 and a circular shaped ceramic lid 116. The header 114 includes an integral pedestal 150 conforming to the shape of the lid 116. A rectangular cavity 124 is defined within the pedestal 150 for receiving the semiconductor chip. The pedestal 150 has a flat upper surface 152 which lies above the principal upper surface 148 of the header 114. The pedestal 150 and lid 116 have cylindrical edges 154 and 156 of the same diameter. These structural features permit bonding of the lid and pedestal using a laser beam 140 directed at right angles to the edges 154 and 156 in the manner depicted in FIG. 6. By continuously rotating the package 112 about the common cylindrical axis of the lid and pedestal through 360 degrees or slightly in excess of 360 degrees, the adjacent edges of the lid and pedestal can be bonded in a single continuous pass of the laser beam 140. All other features of the device 110 and its method of manufacture are similar to the previously described device 10.

Figure 7:
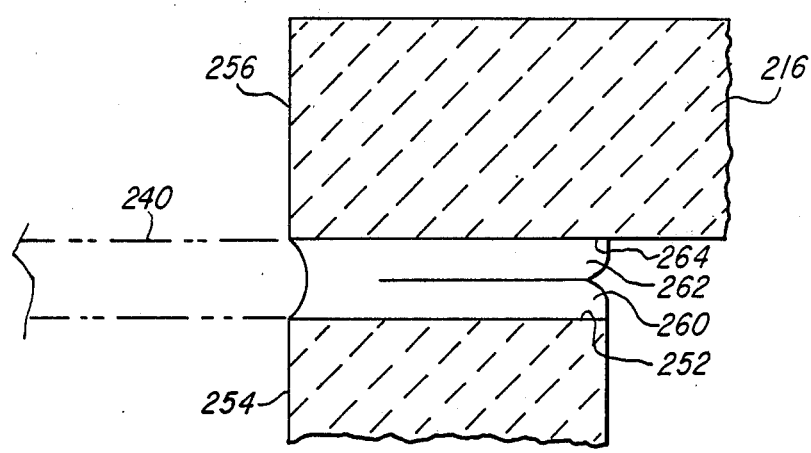
FIG. 7 is a schematic cross section similar to FIG. 6 depicting a second alternate embodiment of the invention.

Referring now to FIG. 7, another alternate embodiment of the invention will be described. Only a fragmentary portion of a semiconductor device 210 is illustrated, the entire structure being similar to the device 110 of FIG. 5. The device 210 includes a ceramic header of which only a portion of an integral pedestal 250 is shown. A disc-shaped ceramic lid 216 is provided for forming a hermetic package with the header. The pedestal and lid preferably have aligned cylindrical surfaces 254 and 256. A first glass layer 260 is provided on the upper surface 252 of the pedestal 250 and a second glass layer 262 is provided on a corresponding lower surface portion 264 of the lid 216. The glass layers 260 and 262 are formed separately by fusing to the pedestal and lid, respectively, at a temperature at or slightly above the melting point of the glass. It will be appreciated that the glass layer 260 is fused to the pedestal 250 prior to installation of the semiconductor chip in the header. After installing the chip and making the necessary electrical interconnections, the lid 216 is placed atop the pedestal 250 and the glass layers 260 and 262 are fused together using a laser beam 240 in the manner indicated while applying a slight downward force to the lid.

In accordance with an important feature of this embodiment, the glass layers 260 and 262 comprise a material that has good light-absorbing properties. An example of a suitable glass material for the layers 260 and 262 is No. 9363 glass sold by Corning Glass, Inc. of New York. Very satisfactory results have been achieved using the previously mentioned Nd:YAG laser and the No. 9363 glass with a laser power of about 17 watts and a scan rate of about 50 inches per minute. The No. 9363 glass has a greenish tint which enables the glass layers 260 and 262 to absorb a sufficient portion of the laser energy to quickly heat the layers so that they are fused together in the area near the surfaces directly exposed to the laser 240. Other glass materials exhibiting different colors have been tested and found to form satisfactory bonds when exposed to a laser beam. For best results, the material of the layers 260 and 262 should be selected to optimize the absorption of energy for the particular wavelength of the laser being employed. Lead-filled glasses have also been tested and have been found to be highly absorptive of laser energy.

Because the glass layers tend to have a somewhat uneven surface, it is preferable to use a greater beam diameter than was mentioned above with reference to the bonding of ceramic to ceramic in which case the surfaces tend to be more planar. A suitable beam diameter for the glass-to-glass bond of FIG. 7 is from about 8 mils to about 12 mils.

In order to eliminate microcracks in the glass bond, the device 240 can be heated to about 200° C. prior to exposing the glass layers 260 and 262 to the laser beam 240 and then allowing the device to cool slowly. Alternatively, the device 210 can be laser bonded at room temperature and then heated to about 250° C. to allow the glass to reflow and heal any fractures or microcracks. Exposure to higher temperatures for very short periods of time can also be effective so long as the semiconductor chip is not subjected to severe thermal stress.

Figure 8:
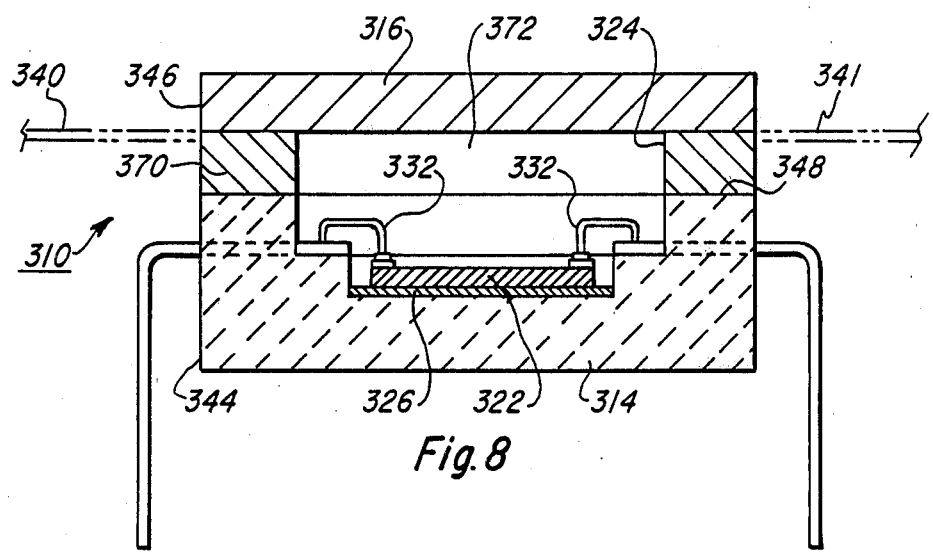
FIG. 8 is a schematic cross section similar to FIG. 2 depicting a third alternate embodiment of the invention.
Figure 9:
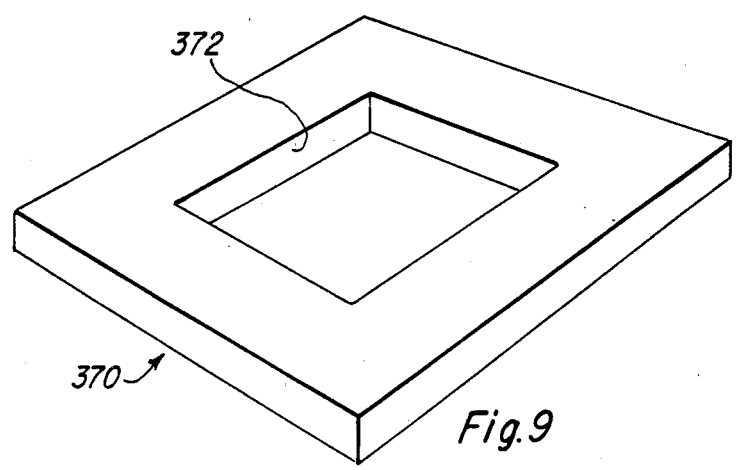
FIG. 9 is a perspective view of a seal ring employed in the embodiment of FIG. 8.

Referring now to FIGS. 8 and 9, another alternate embodiment of the invention will be described. Illustrated in FIG. 8 is a semiconductor device 310 which includes a ceramic header 314 similar in shape and construction to the header 14 illustrated in FIG. 1. A metallic ring 370, which is separately illustrated in FIG. 9, is brazed at a temperature of about 800° C. to an upper surface 348 of the header 314 using a conventional brazing material, such as a copper-silver alloy. The ring 370 has a rectangular opening 372 which permits the semiconductor chip 322 to be installed in the cavity 324 of the header 314 after the brazing operation. Once the semiconductor chip has been installed and the leads 332 connected, a metallic lid 316 can be bonded to the ring 370 preferably two sides at a time using laser beams 340 and 341. Beam diameters as small as 3 to 5 mils can be used to hermetically bond the lid 316 to the ring 370, provided their mating surfaces are sufficiently planar so that their edges will be closely aligned.

The metallic ring 370 and lid 316 preferably comprise a low cost metal having a relatively low reflectivity and a coefficient of thermal expansion that is compatible with the ceramic header 314. The alloy known in the art as Kovar, which comprises about 54% iron, 29% nickel, and 17% cobalt, is the presently preferred metal. Although the ring 370 and lid 316 can comprise materials having a higher reflectivity than Kovar, in which case greater laser energy will be required to create a satisfactory bond, substitutes for Kovar preferably should have a comparable or lower reflectivity.

An advantage of forming a metal-to-metal bond is the lack of any serious incidence of cracking problems, which can occur without proper control in the laser bonding of ceramic to ceramic and glass to glass. Furthermore, since a hermetic metal-to-metal bond can readily be formed using only the heat of the laser (or lasers), the device 310 will be heated to a temperature only slightly above room temperature. Accordingly, an inexpensive hermetic seal can be formed without exposing the semiconductor chip 322 and the underlying bonding layer 326, which preferably comprises the temperature sensitive conductive epoxy mentioned above, to the elevated temperatures needed in prior-art devices to form a hermetic seal.

From the foregoing, it will be apparent that the present invention provides significant advantages over prior-art manufacturing techniques. In addition to achieving reduced material costs and improved yields as previously mentioned, other significant advantages are inherent in the implementation of the present invention. Most notably are improved productivity through the use of automated laser bonding techniques and reduced floor space requirements and energy savings from the elimination of furnaces used in prior-art hermetic seal-forming techniques.

Although several preferred embodiments of the invention have been described in detail, it is to be understood that various changes, substitutions and alterations can be made therein without departing from the spirit and scope of the invention as defined in the appended claims.

What is claimed is:

1. A method of hermetically sealing a semiconductor chip within a package comprising:
   providing a first ceramic member having a plurality of conductive paths hermetically sealed therein;
   providing a plurality of electrically conductive leads for making external connections to the conductive paths;
   bonding a semiconductor chip to a surface of the first ceramic member;

forming electrical connections between regions of the semiconductor chip and the conductive paths;

providing a second ceramic member in abutting relationship with portions of the first ceramic member so as to define a compartment therebetween in which the semiconductor chip resides; and exposing adjacent edges of the first and second ceramic members to a laser beam for a sufficient duration to fuse the adjacent edges together throughout a closed loop so as to hermetically seal the compartment from the surrounding atmosphere.

2. The method of claim 1 wherein the first and second ceramic members comprise similar compositions of aluminum oxide and glass.

3. The method of claim 2 wherein the first and second ceramic members each comprise from about 70% to about 80% aluminum oxide and from about 20% to about 30% glass.

4. The method of claim 1 wherein the ceramic members are maintained at a temperature of about 200° C. during exposure to the laser beam.

* * * * *